(12) United States Patent
Liu et al.

(10) Patent No.: US 10,495,933 B2
(45) Date of Patent: Dec. 3, 2019

(54) ARRAY SUBSTRATE AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Liping Liu, Beijing (CN); Nanhong Zhang, Beijing (CN); Zhanfeng Tang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/742,198

(22) PCT Filed: Jul. 14, 2017

(86) PCT No.: PCT/CN2017/092924
§ 371 (c)(1),
(2) Date: Jan. 5, 2018

(87) PCT Pub. No.: WO2018/036299
PCT Pub. Date: Mar. 1, 2018

(65) Prior Publication Data
US 2019/0086748 A1 Mar. 21, 2019

(30) Foreign Application Priority Data

Aug. 22, 2016 (CN) .......................... 2016 1 0700967

(51) Int. Cl.
G02F 1/1362 (2006.01)
G02F 1/1337 (2006.01)
(Continued)

(52) U.S. Cl.
CPC ...... *G02F 1/136227* (2013.01); *G02F 1/1337* (2013.01); *G02F 1/1362* (2013.01);
(Continued)

(58) Field of Classification Search
CPC ... H01L 27/1214; H01L 27/124; H01L 33/38; G02F 1/136227; G02F 1/1368; G02F 1/136286
See application file for complete search history.

(56) References Cited

U.S. PATENT DOCUMENTS 6,501,096 B1   12/2002  Hashimoto et al.
2009/0009677 A1*  1/2009  Yamazaki ............. G02F 1/1368
                                                     349/43
(Continued)

FOREIGN PATENT DOCUMENTS

CN     104662470 A    5/2015
CN     104777676 A    7/2015
(Continued)

OTHER PUBLICATIONS

International Search Report dated Sep. 27, 2017 issued in corresponding International Application No. PCT/CN2017/092924.
(Continued)

*Primary Examiner* — Joseph C. Nicely
(74) *Attorney, Agent, or Firm* — Nath, Goldberg & Meyer; Joshua B. Goldberg

(57) ABSTRACT

The application discloses an array substrate and a display device, and belongs to the field of display technology. The array substrate comprises a base substrate, and a via hole and a diffusion part above the base substrate, and an orthographic projection of the diffusion part on the base substrate is contiguous to that of the via hole on the base substrate. The diffusion part is used for causing alignment liquid at a position corresponding to the via hole to diffuse. Since the
(Continued)

array substrate is provided with the diffusion part for causing alignment liquid at a position corresponding to the via hole to diffuse, and the orthographic projection of the diffusion part on the base substrate is contiguous to that of the via hole on the base substrate, the alignment liquid at the position corresponding to the via hole will be guided by the diffusion part to diffuse uniformly.

10 Claims, 5 Drawing Sheets

(51) Int. Cl.
  *G02F 1/1368* (2006.01)
  *H01L 27/12* (2006.01)
  *G02F 1/1333* (2006.01)
  *H01L 33/38* (2010.01)

(52) U.S. Cl.
  CPC ...... *G02F 1/1368* (2013.01); *G02F 1/136286* (2013.01); *H01L 27/124* (2013.01); *H01L 27/1214* (2013.01); *G02F 2001/133357* (2013.01); *G02F 2001/136295* (2013.01); *G02F 2201/121* (2013.01); *G02F 2201/123* (2013.01); *H01L 27/1248* (2013.01); *H01L 33/38* (2013.01)

(56) References Cited

U.S. PATENT DOCUMENTS

| | | | |
|---|---|---|---|
| 2015/0116623 A1* | 4/2015 | Tomioka | G02F 1/136227 349/43 |
| 2015/0228675 A1 | 8/2015 | Takanishi et al. | |
| 2016/0181291 A1 | 6/2016 | Katoh et al. | |
| 2017/0235167 A1* | 8/2017 | Ishikawa | G02F 1/133345 349/43 |

FOREIGN PATENT DOCUMENTS

| | | | | |
|---|---|---|---|---|
| CN | 105452949 A | | 3/2016 | |
| CN | 205248273 | * | 5/2016 | ............ H01L 27/12 |
| CN | 205248273 U | | 5/2016 | |
| CN | 105652546 A | | 6/2016 | |
| CN | 105655360 A | | 6/2016 | |
| CN | 106444187 A | | 2/2017 | |

OTHER PUBLICATIONS

First Office Action dated Nov. 6, 2017 issued in corresponding Chinese Application No. 201610700967.X.

\* cited by examiner

ARRAY SUBSTRATE AND DISPLAY DEVICE

CROSS-REFERENCE TO RELATED APPLICATION

This is a National Phase Application filed under 35 U.S.C. 371 as a national stage of PCT/CN2017/092924, filed on Jul. 14, 2017, an application claiming priority to Chinese Patent Application No. 201610700967.X, titled "Array Substrate and Display Device", filed on Aug. 22, 2016, the disclosure of which is hereby incorporated by reference in its entirety.

TECHNICAL FIELD

The present disclosure relates to the field of display technology, and more particularly, to an array substrate and a display device.

BACKGROUND

Typically, a liquid crystal display comprises an array substrate and a color film substrate disposed opposite to each other, and a liquid crystal layer between the array substrate and the color film substrate.

SUMMARY

The present application is intended to provide an array substrate and a display device capable of causing the alignment liquid to diffuse uniformly.

The present disclosure provides an array substrate comprising a base substrate and a via hole above the base substrate, wherein the array substrate further comprises a diffusion part for causing alignment liquid at a position corresponding to the via hole to diffuse, and an orthographic projection of the diffusion part on the base substrate is contiguous to that of the via hole on the base substrate.

Wherein, the array substrate further comprises a thin film transistor on the base substrate, a planarization layer above the thin film transistor, and a pixel electrode above the planarization layer; and the via hole is provided in the planarization layer at a position corresponding to a drain of the thin film transistor, and is used for electrically connecting the drain of the thin film transistor to the pixel electrode.

Wherein, the diffusion part is a recess in the pixel electrode.

Wherein, a depth of the recess is equal to a thickness of the pixel electrode.

Wherein, a shape of the recess is a rectangle.

Wherein, a length of the recess ranges from 1 μm to 20 μm; and a width of the recess ranges from 1 μm to 100 μm.

Wherein, the diffusion part is a concave in the planarization layer.

Wherein, the concave is provided in the planarization layer at a side of the via hole distal to the thin film transistor.

Wherein, the concave is provided in the planarization layer at two opposite sides of the via hole.

Wherein, a depth of the concave is less than a thickness of the planarization layer.

Wherein, a shape of the concave is a rectangle.

Wherein, a length of the concave ranges from 1 μm to 20 μm; and a width of the concave ranges from 1 μm to 500 μm.

The present disclosure further provides a manufacturing method of an array substrate comprising a step of forming a via hole above a base substrate; the manufacturing method further comprises a step of forming a diffusion part for causing alignment liquid at a position corresponding to the via hole to diffuse; and wherein an orthographic projection of the diffusion part on the base substrate is contiguous to that of the via hole on the base substrate.

Optionally, the manufacturing method specifically comprises steps of:

forming a thin film transistor on the base substrate by a patterning process;

forming a planarization layer, and forming a pattern comprising the via hole in the planarization layer at a position corresponding to a drain of the thin film transistor by a patterning process; and forming a pattern comprising a pixel electrode and the diffusion part by a single patterning process such that the pixel electrode is electrically connected to the drain of the thin film transistor through the via hole, and the diffusion part is a recess in the pixel electrode.

Optionally, the manufacturing method specifically comprises steps of:

forming a thin film transistor on the base substrate by a patterning process;

forming a planarization layer, and forming a pattern comprising the via hole and the diffusion part in the planarization layer at a position corresponding to a drain of the thin film transistor by a single patterning process such that the diffusion part is a concave in the planarization layer.

Wherein the step of forming the pattern comprising the via hole and the diffusion part in the planarization layer at a position corresponding to a drain of the thin film transistor by a single patterning process is performed by using a gray-scale mask or a half-tone mask.

The present disclosure further provides a display device comprising the array substrate as mentioned above.

BRIEF DESCRIPTION OF THE FIGURES

The present application will be further described below in conjunction with accompanying drawings, and the present application is not limited thereto.

REFERENCE NUMERALS

10. base substrate; 1. thin film transistor; 2. planarization layer; 3. pixel electrode; 4. diffusion part; 11. drain; 21. via hole.

DETAILED DESCRIPTION

The present application will be further described below in conjunction with accompanying drawings and specific implementations in order that an ordinary person skilled in the art can understand the technical solutions of the present application better.

Figure 1:
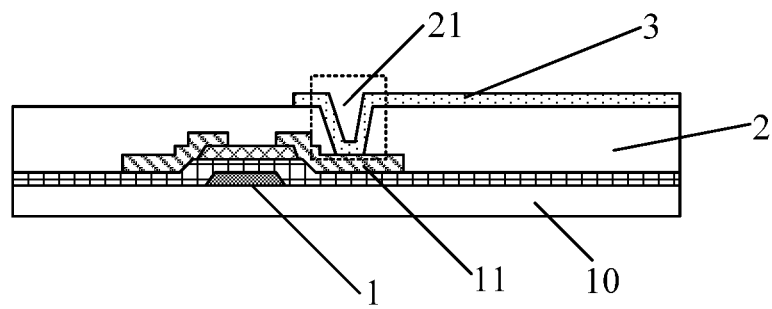
FIG. 1 is a cross sectional view of an existing array substrate.
Figure 2:
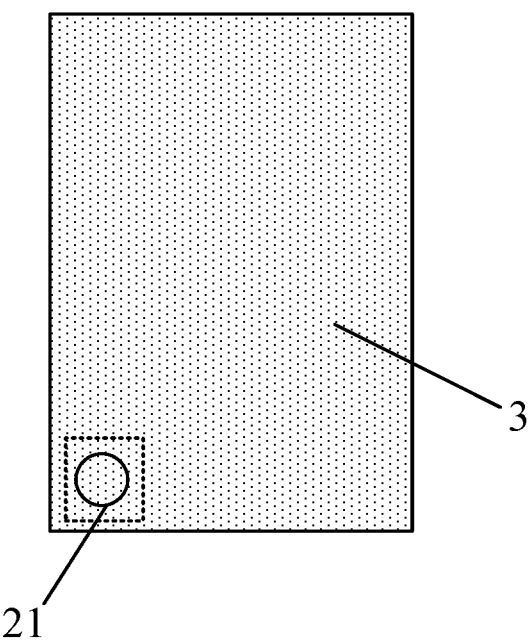
FIG. 2 is a plan view of the existing array substrate.

As shown in FIGS. 1 and 2, the array substrate typically comprises a base substrate 10; a thin film transistor 1 formed on the base substrate 10; a planarization layer 2 formed above a layer in which the thin film transistor 1 is located, wherein a via hole 21 is provided in the planarization layer 2 at a position corresponding to a drain 11 of the thin film transistor 1; a pixel electrode 3 formed above the planarization layer 2, the pixel electrode 3 being connected to the drain 11 of the thin film transistor 1 through the via hole 21; and an alignment layer formed above the pixel electrode 3.

The alignment layer is typically formed by spraying alignment liquid onto the pixel electrode 3 and then curing the alignment liquid. Since the planarization layer 2 is provided with the via hole 21 therein, the surface of the array substrate is not flat (the position indicated by the dotted-line block), i.e., the topography of the surface is not uniform. For this reason, after the alignment liquid is sprayed onto the surface, the diffusion velocity of the alignment liquid at the position corresponding to the via hole 21 is significantly different from that at other positions, which is apt to cause a problem of non-uniform diffusion of the alignment liquid, and thus the resultant alignment layer has a non-uniform thickness. If such an array substrate is applied to a display device, a problem of display defect will occur.

The present application provides an array substrate which comprises a base substrate, and a via hole and a diffusion part above the base substrate; wherein an orthographic projection of the diffusion part on the base substrate is contiguous to that of the via hole on the base substrate; and the diffusion part is configured to cause alignment liquid at a position corresponding to the via hole to diffuse.

The array substrate of the present application is provided therein with the diffusion part for causing alignment liquid at a position corresponding to the via hole to diffuse, and the orthographic projection of the diffusion part on the base substrate is contiguous to that of the via hole on the base substrate; thus, before the alignment liquid is sprayed thereon, the surface of the diffusion part is connected between the surface of the array substrate and a depressed surface at the position corresponding to the via hole. Thereafter, when the alignment liquid is sprayed onto the surface of the array substrate, the alignment liquid at the position corresponding to the via hole will be guided by the diffusion part so as to diffuse uniformly, and thereby the problem of display defect caused by non-uniform diffusion of the alignment liquid is avoided.

The array substrate of the present embodiment will be described below in conjunction with two preferred implementations.

Figure 3:
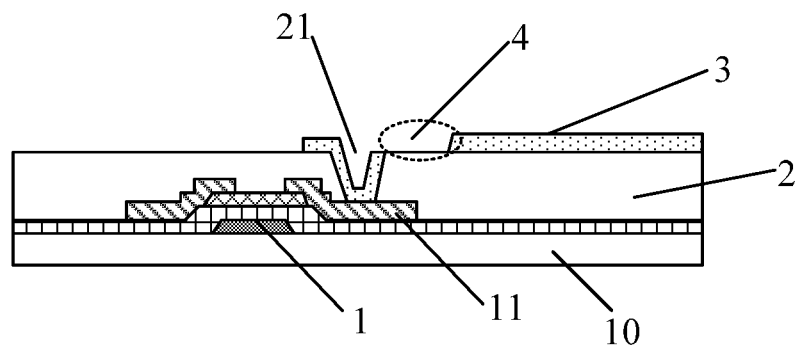
FIG. 3 is a cross sectional view of an array substrate of a first preferred implementation in an embodiment of the present application.
Figure 4:
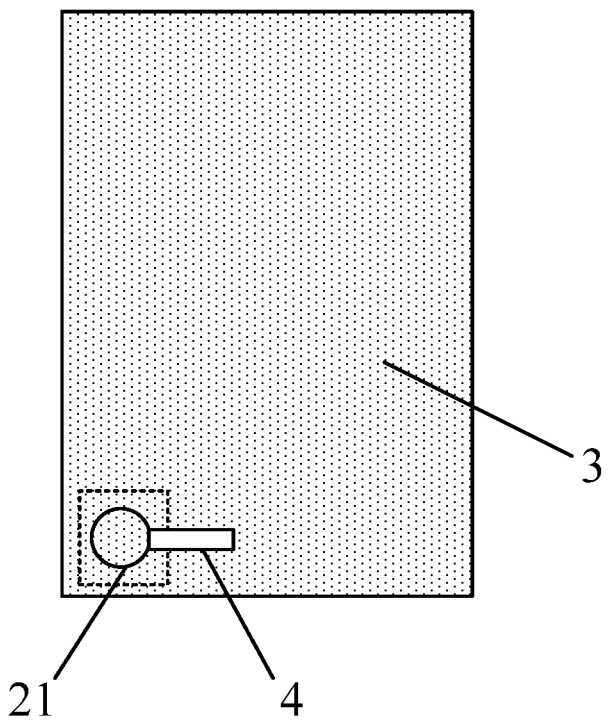
FIG. 4 is a plan view of the array substrate of the first preferred implementation in the embodiment of the present application.

As shown in FIGS. 3 and 4, as a first preferred implementation of the present embodiment, the array substrate comprises a base substrate 10, a thin film transistor 1 on the base substrate 10, a planarization layer 2 above the thin film transistor 1, and a pixel electrode 3 above the planarization layer 2; wherein a via hole 21 is provided in the planarization layer 2 at a position corresponding to a drain 11 of the thin film transistor 1, and is used for electrically connecting the drain 11 of the thin film transistor 1 to the pixel electrode 3; a diffusion part 4 is provided in the pixel electrode 3 so as to cause alignment liquid at a position corresponding to the via hole 21 to diffuse, an orthographic projection of the diffusion part 4 on the base substrate 10 is contiguous to that of the via hole 21 on the base substrate 10, and the via hole 21 is used for connecting the pixel electrode 3 to the drain 11 of the thin film transistor 1.

The diffusion part 4 may be a recess of a rectangular shape, having its depth optionally being equal to a thickness of the pixel electrode 3, its width being 1 μm to 20 μm, and its length being 1 μm to 100 μm. Obviously, the diffusion part 4 may have any other shape or dimension in the light of practical conditions.

In this case, it can be seen that, a surface (upper surface) of the above array substrate opposite to the base substrate 10 has a concave-down topography at the position corresponding to the via hole 21; however, due to the fact that the diffusion part 4, which has an orthographic projection on the base substrate 10 contiguous to that of the via hole 21 on the base substrate 10 and has a shape of a recess, is provided in the pixel electrode 3, a height of the array substrate at the position corresponding to the diffusion part 4 is lower than that of the array substrate at another position around the via hole 21; thereby, when alignment liquid is then sprayed, the alignment liquid at the position corresponding to the via hole 21 will be guided by the diffusion part 4 so as to diffusion uniformly, and thus the problem of display defect caused by non-uniform diffusion of the alignment liquid is avoided.

Figure 5:
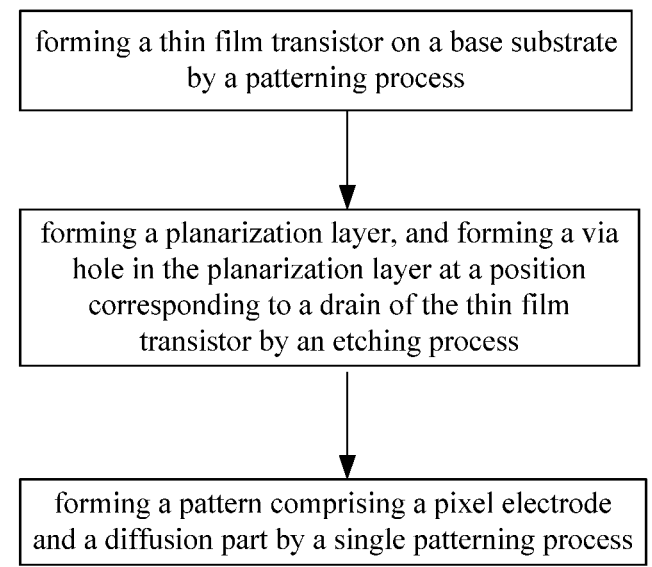
FIG. 5 is a flow chart illustrating a manufacturing method of the array substrate shown in FIG. 4.

As for the above array substrate, the present embodiment further provides a manufacturing method of such an array substrate, as shown in FIG. 5, comprising specifically the following steps:

Step 1: forming the thin film transistor 1 on the base substrate 10 by a patterning process.

Taking a case that the thin film transistor 1 formed in this step is a bottom-gate type thin film transistor as an example, this step is performed by a sequence: a gate/gate line→a gate insulation layer→an active layer→a source/drain 11.

Step 2: on the base substrate 10 after Step 1, forming the planarization layer 2, and forming the via hole 11 in the planarization layer 2 at a position corresponding to the drain 11 of the thin film transistor 1 by an etching process.

Step 3: on the base substrate 10 after Step 2, forming a pattern comprising the pixel electrode 3 and the diffusion part 4 by a single patterning process; wherein the pixel electrode 3 is electrically connected to the drain 11 of the thin film transistor 1 through the via hole; and the diffusion part 4 is a recess located in the pixel electrode 3.

Obviously, the method may further comprise steps of, on the base substrate 1 after the above three steps, spraying the alignment liquid and then curing the alignment liquid to form an alignment layer.

Figure 6:
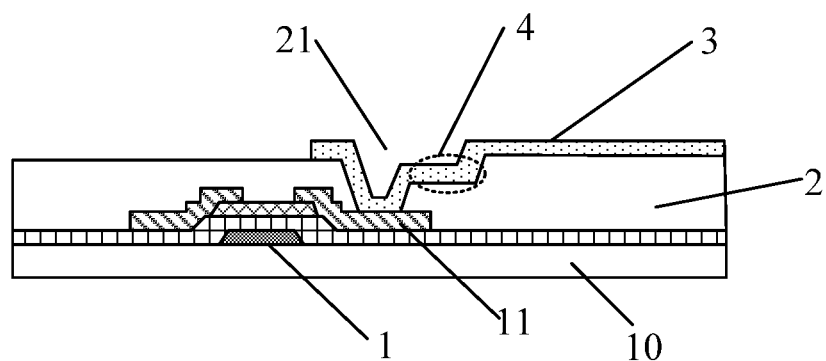
FIG. 6 is a cross sectional view of an array substrate of a second preferred implementation in the embodiment of the present application.

As shown in FIG. 6, as a second preferred implementation of the present embodiment, the array substrate in this implementation differs from that in the first preferred implementation only in the position at which the diffusion part 4 is provided. In this implementation, the diffusion part 4 is disposed in the planarization layer 2, and the orthographic projection of the diffusion part 4 on the base substrate 10 is contiguous to that of the via hole 21 in the planarization layer 2 on the base substrate 10. That is to say, the diffusion part 4 and the via hole 21 are formed to be an integrated structure. For example, the diffusion part 4 is provided as a concave. In this case, it can be seen that a step is formed at a side where the via hole 21 is connected to the diffusion part 4. Obviously, a thickness of a portion of the planarization layer 2 corresponding to the concave is lower than that of a portion of the planarization layer 2 around the via hole 21. Thus, when the alignment liquid is then sprayed, the alignment liquid at the position corresponding to the via hole 21 will be guided by the diffusion part 4 so as to diffuse uniformly, and thereby the problem of display defect caused by non-uniform diffusion of the alignment liquid is avoided.

The thickness of the concave may be less than that of the planarization layer 2. In this case, the via hole 21 and the concave which are provided in the planarization layer 2 may be formed by a single patterning process by using a gray-scale mask or a half-tone mask.

The number and specific dimensions of the diffusion parts 4 may be set according to the diffusibility of the alignment liquid to be sprayed later. For example, the concave is provided in the planarization 2 at a side of the via hole 21 distal to the thin film transistor 1, and at this time, the sprayed alignment liquid will diffuse to a display region of the array substrate through the concave. The display region refers to a region in the array substrate for display, through which light emitted from a backlight may be transmitted.

The width of the concave may be 1 μm to 20 μm, and the length thereof may be 1 μm to 500 μm.

Figure 7:
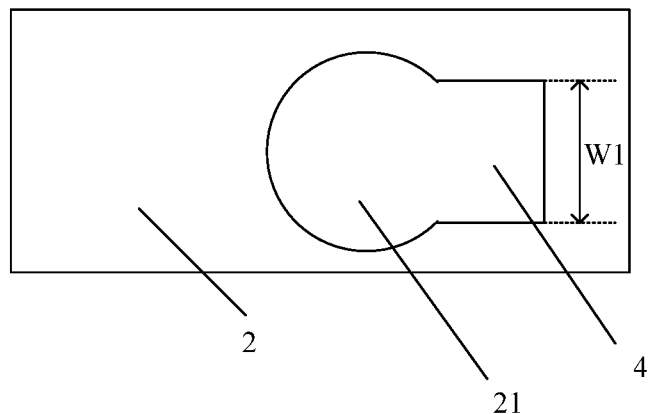
FIGS. 7 to 10 are plan views of planarization layers with various diffusion parts of the array substrates of the second preferred implementation in the embodiment of the present application.
Figure 8:
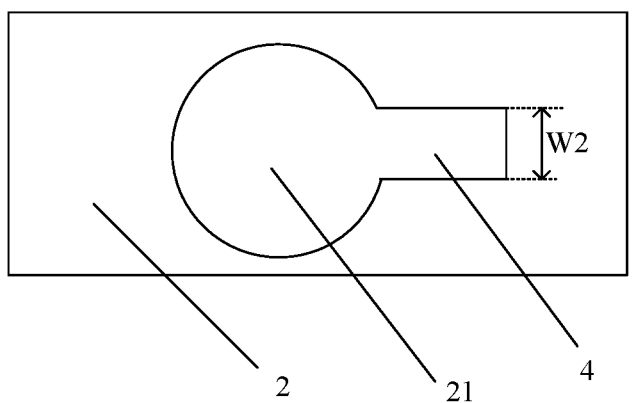
Figure 9:
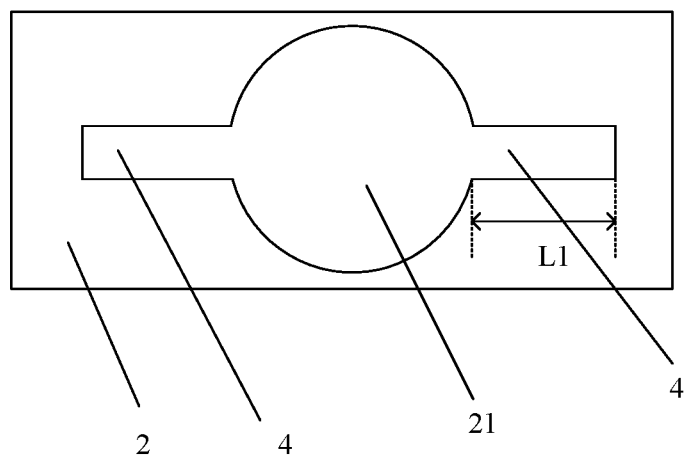
Figure 10:
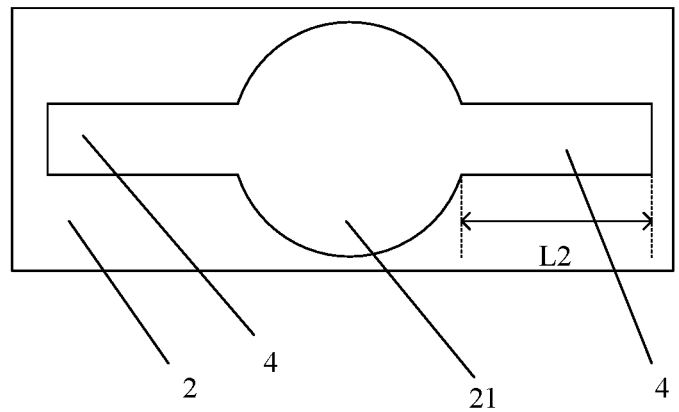

Obviously, the dimension and the shape of the diffusion part 4 may be designed in the light of practical conditions. As shown in FIGS. 7 to 10, if the alignment liquid has a perfect diffusibility, the diffusion part 4 may be provided only at one side of the via hole 21 close to the display region. The better the diffusibility of the alignment liquid is, the wider the width of the diffusion part is designed (as shown in FIGS. 7 and 8, W1 is larger than W2). If the alignment liquid has a poor diffusibility, two diffusion parts 4 may be respectively provided at two sides of the via hole 21 in the way as mentioned above. The poorer the diffusibility of the alignment liquid is, the slenderer the shape of the diffusion part is designed (as shown in FIGS. 9 and 10, L1 is smaller than L2). Such a design facilitates alleviating the surface tension of the alignment liquid so as to cause the alignment liquid to diffuse more uniformly.

Figure 11:
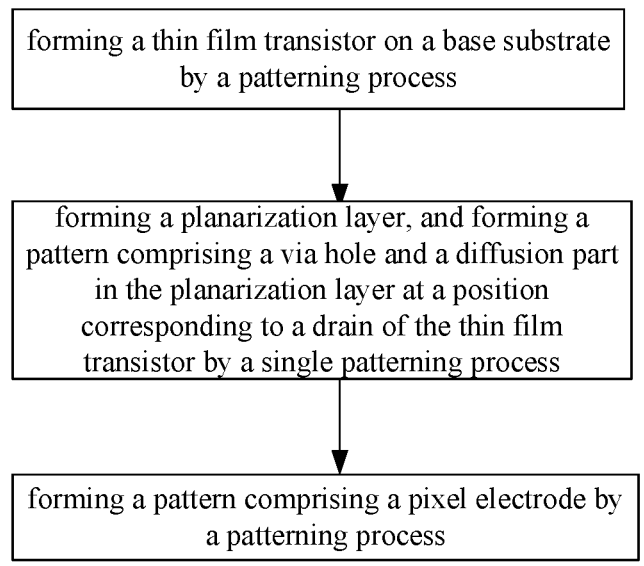
FIG. 11 is a flow chart illustrating a manufacturing method of the array substrate shown in FIG. 6.

As for the above array substrate, the present embodiment further provides a manufacturing method of the array substrate, as shown in FIG. 11, comprising the following steps.

Step 1: forming the thin film transistor 1 on the base substrate 10 by a patterning process.

Taking a case that the thin film transistor 1 formed in this step is a bottom-gate type thin film transistor as an example, this step is performed by a sequence: a gate/gate line→a gate insulation layer→an active layer→a source/drain 11.

Step 2: on the base substrate 10 after Step 1, forming the planarization layer 2, and forming a pattern comprising the via hole 11 and the diffusion part 4 at a position in the planarization layer 2 corresponding to the drain 11 of the thin film transistor 1 by a single patterning process; wherein the diffusion part 4 is a concave in the planarization layer.

In Step 2, specifically, the planarization layer 2 is exposed by using a half-tone mask or a gray-scale mask, and the pattern comprising the via hole 21 and the diffusion part 4 is formed by a single patterning process.

Step 3: on the base substrate 10 after Step 2, forming a pattern comprising the pixel electrode 3 by a patterning process; wherein the pixel electrode 3 is electrically connected to the drain 11 of the thin film transistor 1 through the via hole 21.

Obviously, the method may further comprise steps of, on the base substrate 1 after the above three steps, spraying the alignment liquid and then curing the alignment liquid to form an alignment layer.

It should be noted that, although the array substrate of the present embodiment is described by employing only the above two specific implementations, actually, the diffusion part 4 is not limited to be provided in the pixel electrode 3 or in the planarization layer 2, and may also be provided in any of other layers in the array substrate, as long as it can be ensured that the projections of the diffusion part 4 and the via hole on the base substrate 10 are contiguous to each other such that the diffusion part 4 is able to cause the alignment liquid at the position corresponding to the via hole 21 to diffuse. It should be also appreciated that, in the present embodiment, it is only an illustrative example that the diffusion part 4 is disposed at the position corresponding to the via hole 21 used for connecting the drain 11 of the thin film transistor 1 with the pixel electrode 3 so as to improve the diffusion uniformity of the alignment liquid at this position. Actually, the via hole may be a via hole used for connecting the common electrode and the common electrode line, and according to the above concept, the diffusion part 4 may be disposed at the position corresponding to such a via hole so as to improve the diffusion uniformity of the alignment liquid. Similarly, the diffusion part 4 may be disposed at a position corresponding to any via hole in the array substrate according to the above concept.

The present application further provides a display device which comprises the array substrate in the above embodiment. Therefore, the display device has a better display effect.

The display device may be a liquid crystal display device or an electroluminescent display device, for example, any product or component having the display function, such as a liquid crystal panel, an electronic paper, a mobile, a tablet, a television, a display, a notebook, a digital photo frame, a navigator, and so on.

It will be appreciated that the above embodiments are exemplary implementations for the purpose of illustrating the principle of the present application only, and the present application is not limited thereto. It will be apparent to an ordinary person skilled in the art that many variations and modifications may be made without departing from the spirit and essence of the present application. These variations and modifications should also be considered as the protective scope of the present application.

What is claimed is:

1. An array substrate, comprising a base substrate and a via hole above the base substrate, wherein the array substrate further comprises a diffusion part for causing alignment liquid at a position corresponding to the via hole to diffuse, and an orthographic projection of the diffusion part on the base substrate is contiguous to that of the via hole on the base substrate, the array substrate further comprises a thin film transistor on the base substrate, a planarization layer above the thin film transistor, and a pixel electrode above the planarization layer;

the via hole is provided in the planarization layer at a position corresponding to a drain of the thin film transistor, and is used for electrically connecting the drain of the thin film transistor to the pixel electrode; and the diffusion part is a recess in the pixel electrode.

2. The array substrate of claim 1, wherein a depth of the recess is equal to a thickness of the pixel electrode.

3. The array substrate of claim 1, wherein a shape of the recess is a rectangle.

4. The array substrate of claim 3, wherein a length of the recess ranges from nm to 20 μm, and a width of the recess ranges from 1 μm to 100 μm.

5. A display device, comprising the array substrate of claim 1.

6. The display device of claim 5, wherein a depth of the recess is equal to a thickness of the pixel electrode.

7. The display device of claim 5, wherein a shape of the recess is a rectangle.

8. The display device of claim 7, wherein a length of the recess is in the range of 1 μm to 20 μm, and a width of the recess is in the range of 1 μm to 100 μm.

9. An array substrate, comprising a base substrate and a via hole above the base substrate, wherein the array substrate further comprises a diffusion part for causing alignment liquid at a position corresponding to the via hole to diffuse, and an orthographic projection of the diffusion part on the base substrate is continuous to that of the via hole on the base substrate, the array substrate further comprises a thin film transistor on the base substrate, a planarization layer above the thin film transistor, and a pixel electrode above the planarization layer;

the via hole is provided in the planarization layer at a position corresponding to a drain of the thin film transistor, and is used for electrically connecting the drain of the thin film transistor to the pixel electrode;

the diffusion pan is a concave in the planarization layer;

a shape of the concave is a rectangle; and a length of the concave ranges from 1 μm to 20 μm, and a width of the concave ranges from 1 μm to 500 μm.

10. A manufacturing method of an array substrate, comprising a step of forming a via hole above a base substrate, wherein the manufacturing method further comprises a step of forming a diffusion part for causing alignment liquid at a position corresponding to the via hole to diffuse; and wherein an orthographic projection of the diffusion part on the base substrate is contiguous to that of the via hole on the base substrate, wherein the manufacturing method specifically comprises steps of:

forming a thin film transistor on the base substrate by a patterning process;

forming a planarization layer, and forming a pattern comprising the via hole in the planarization layer at a position corresponding to a drain of the thin film transistor by a patterning process; and forming a pattern comprising a pixel electrode and the diffusion part by a single patterning process such that the pixel electrode is electrically connected to the drain of the thin film transistor through the via hole, and the diffusion part is a recess in the pixel electrode.

* * * * *